United States Patent [19]

Arai

[11] Patent Number: 4,840,876
[45] Date of Patent: Jun. 20, 1989

[54] METHOD OF TREATING PHOTORESISTS

[75] Inventor: Tetsuji Arai, Yokohama, Japan

[73] Assignee: Ushio Denki, Tokyo, Japan

[21] Appl. No.: 147,419

[22] Filed: Jan. 26, 1988

[30] Foreign Application Priority Data

Mar. 24, 1987 [JP] Japan .................................. 62-67889

[51] Int. Cl.$^4$ .............................................. G03C 5/36
[52] U.S. Cl. ..................................... 430/328; 430/330
[58] Field of Search ................ 430/328, 330, 326, 311

[56] References Cited

U.S. PATENT DOCUMENTS 4,548,688 10/1985 Matthews ........................ 204/159.18
4,749,436 6/1988 Minato et al. ......................... 156/345

OTHER PUBLICATIONS

Maron et al., Fundamentals of Physical Chemistry, 1974, Chap. 17, pp. 737 and 739, "Effect of Temperature on Photochemical Reactions".
Yanazawa et al., "Double Exposure Stabilization of Positive Photoresist", Journal of Applied Polymer Science, vol. 30, pp. 547–555 (1985).
Takasu et al., "Deep UV Hardening of Photo– and Electron Resist Patterns", Dry Process Symposium, pp. 60–65 (1984).
Matthews et al., "Stabilization of Single Layer and Multilayer Resist Patterns to Aluminum Etching Environments", (1984).
Hiraoka et al., (A), "High Temperature Flow Resistance of Micron Sized Images in AZ Resists", J. Electrochem. Soc.: Solid-State Science and Technology, Dec. 1981, pp. 2645–2647.
Allen et al., "Deep UV Hardening of Positive Photoresist Patterns", Journal of the Electrochemical Society, Jun. 1982, pp. 1379–1381.
Hiraoka et al., (B), "UV Hardening of Photo– and Electron Resist Patterns", J. Vac. Sci. Technol., 19(4), Nov./Dec. 1981, pp. 1132–1135.

Primary Examiner—Jose G. Dees
Attorney, Agent, or Firm—Armstrong, Nikaido, Marmelstein, Kubovcik & Murray

[57] ABSTRACT

An ultraviolet radiation method of treating positive photoresist materials to enhance the thermal stability of positive photoresist film on a semiconductor wafer employing heating and ultraviolet irradiation. The process improves the heat-resistance and plasma-resistance of the photoresist image. The initial heating temperature of the photoresist is set to be a little higher than the initial flow temperature of the photoresist, and the temperature of the developed positive photoresist image is raised in proportion as the flow temperature of said photoresist image is increased by exposing the photoresist placed in gas of a lower atmospheric pressure to ultraviolet radiation and/or heating.

12 Claims, 1 Drawing Sheet

METHOD OF TREATING PHOTORESISTS

BACKGROUND OF THE INVENTION

1. Field of the Invention

This invention relates to a method of treating positive photoresist materials applied on a semiconductor wafer and, more particularly, to a method of treating the developed positive photoresist image on a wafer photoresist placed in a chamber employing heating and ultraviolet irradiation.

2. Description of the Prior Art

In the manufacture of semiconductor devices, a process of forming a photoresist pattern comprises the steps of "coating", "prebaking", "exposure", "development" and "postbaking", when roughly divided. Thereafter, for instance, ion implantation or plasma-etching of a silicon oxide film, a silicon nitride film or an aluminum film, which are formed beforehand on the surface of the semiconductor wafer prior to the coating of the photoresist material, is executed. In this case, it is preferable that the photoresist have a high heat-resistance or etching-resistance, since the temperature thereof rises in the process of ion implantation or plasma-etching. However, a photoresist material which has been used for high resolution in recent years for semiconductor devices is highly integrated and made highly fine, is of a positive type photoresist, and the heatresistance of the photoresist of this type is generally inferior to the one of a negative type photoresist.

With a view to enhancing the heat-resistance and plasma-resistance of the photoresist, examinations in a reference of H. Hiraoka and J. Pacansky: J. Vac, Sci. Tech. 19(1981), and U.S. application No. 923,505 discloses a method in which a photoresist material is heated gradually to an elevated temperature for a sufficient time in postbaking, and a method in which ultraviolet radition is applied to a photoresist pattern after development thereof. However, in the former method satisfactory heat-resistance and plasma-resistance fails to be obtained in w short time, that is, the photoresist must be exposed to ultraviolet radiation for a considerably long time. The latter method, on the other hand, has a fault that, although the heat-resistance temperature thereof is raised by exposing the photoresist to ultraviolet radiation, ultraviolet rays do not penetrate to the bottom of the film of photoresist material when it is thicker, which results in an insufficient improvement in the heat-resistance of the entire part in the direction of depth of film of the photoresist material and requires a considerably long exposure time.

In view of these faults, a method of combination of "heating" with "ultraviolet irradiation" has been proposed recently, as is disclosed in U.S. Pat. No. 4,548,688 for instance. This method, however, is unable to meet the demands for improvements in productivity, throughput in a manufacturing process, and etc, since the temperature of the photoresist is raised below the flow temperature of the photoresist driving the entire time of treating the photoresist in a chamber. Thus the faults in the aforesaid prior-art still remain as "problems to be dissolved".

As described above, the prior-art methods for particular treatments of the developed positive photoresist image, such as hardening the photoresist materials employing ultraviolet irradiation, include the problems that a long exposure time for ultraviolet radiation is required for the treatment and that the improvement in the heat-resistance is insufficient in the bottom portion of the developed positive photoresist film when a film is thick, though they have been able to achieve some improvements in the heat-resistance and the plasma-resistance. In other words, there has been left unsettled a problem that the whole treatment of the developed positive photoresist pattern can not be performed in anorganized and effective manner.

SUMMARY OF THE INVENTION

An object of the invention is to perform treatments fo positive photoresists effectively by an organized combination of heating with ultraviolet irradiatin and lower pressure gas.

The initial heating temperature of the developed positive photoresist image placed in a chamber filled with gas of lower pressure than 1 atmospheric pressure is set to be a little higher than the initial flow temperature, and the temperature of the developed positive photoresist image is raised in proportion to the flow temperature, according to this invention. Therefore, both the heat-resistance and the plasma-resistance can be improved by the heating and the ultra-violet irradiation in a short time, and thus the productivity is improved remarkably. A particular advantageous effect is that the heat-resistance and plasma-resistance of the bottom portion of a photoresist film can be improved sufficiently by ultraviolet rays permeating to the bottom of the developed positive photoresist film. Although the temperature rises a little higher than the flow temperature, the change in the shape of a developed positive photoresist pattern is so small, as 1% or less in dimensions in width of the photoresist, thus causing no hindrance practically.

"The flow temperature" referred to in this specification means a maximum temperature at which the shape of a photoresist pattern does not change even when the photoresist is kept at the said a temperature for 30 minutes. This maximum temperature differs, of course, according to the kind and the film thickness of the developed positive photoresist image.

In more detail, exposing the developed positive photoresist image to ultraviolet radiation in a chamber filled with gas of lower pressure than 1 atmospheric pressure is started at the initial temperature of the photoresist set to be higher than the initial flow temperature thereof, and the temperature of the developed positive photoresist image is raised accordingly as the flow temperature thereof is increased by ultraviolet irradiation, according to this invention.

Moreover, accordingly as the developed positive photoresist is exposed to ultraviolet radiation, the flow temperature rises, that is, the heat-resistance of the photoresist is improved, and therefore the photoresist is treated in accordance with an increase in the flow temperature and at a little higher temperature, for instance, several degrees centigrade above the flow temperature. In other words, the temperature of the photoresist rises little by little as it is a little higher than the flow temperature in each step of the exposure, although the temperature of the photoresist is kept higher than the flow temperature, and therefore the shape of the pattern is not impaired virtually. Even if the photoresist is exposed at a temperature about 10° C. higher than the flow temperature, for example, for a shorter time than a few minutes, disorder of the shape of the pattern is about 1% at most of the dimensions in width of the pattern before the treatment. Accordingly, no hindrance is caused even if the photoresist image is treated at a little higher temperature than the flow temperature, and moreover, as a developed positive photoresist image is placed in a chamber filled with gas of lower pressure than 1 atmospheric pressure, consequently it is possible to increase the speed of treatment of the photoresist and to improve the productivity, and to harden the bottom portion of the film of the photoresist material, and thus the heat-resistance of the bottom portion of the film is improved sufficiently even when the film is thick.

Other objects and advantages of this invention will become apparent from the following description of the preferred embodiment of the invention, taken in conjunction with the accompanying drawings.

DESCRIPTION OF THE PREFERRED EMBODIMENT

Figure 1:
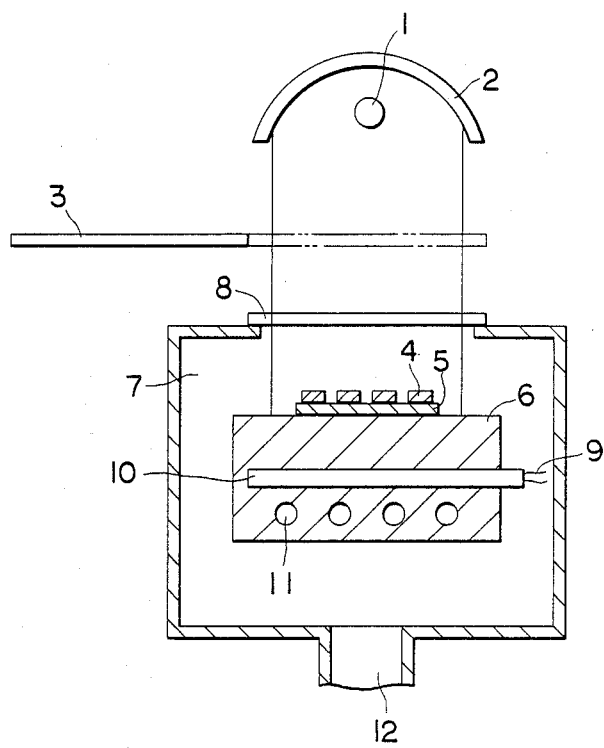
FIG. 1 shows an embodiment of an apparatus for executing method for treatment of developed positive photoresist images according to this invention.

A preferred embodiment of the invention will be described hereinafter with reference to the accompanying drawings in which FIG. 1 is an illustration of an embodiment of an apparatus for executing a method of treating the developed positive photoresist image according to this invention.

A chamber 7 has a radiation window 8 at the top formed of quartz glass and at the bottom an exhaust hole 12. The exhaust hole 12 is connected to a vacuum pump, not shown, which reduces the pressure of gas, such as air in the chamber 7.

A pattern of said photoresist 4 is formed on a semiconductor wafer 5, which is placed on a support 6. The support 6 is heated by a heater 10 connected with power supply through a heater lead wire 9, or cooled down by cooling water passed through a cooling conduit 11. The temperature of the semiconductor wafer 5 is controlled by these heating and cooling mechanisms. Moreover, the chamber 7 is provided with the exhaust hole 12 connected with a vacuum pump through a connecting conduit. A part of an ultraviolet radiation apparatus arranged on the upper part of the radiation window 8 is composed of a high pressure mercury vapor lamp 1, a concave mirror 2, and a shutter 3 which can be opened and closed. A radiant light containing ultraviolet rays, which is emitted from the high pressure mercury vapor lamp 1, is reflected by the concave mirror 2 or the like and projected onto the photoresist 4 applied on the semiconductor wafer 5.

Next, a description will be made on a method of treating the developed positive photoresist image by using this apparatus. The semiconductor wafer 5 coated with the photoresist 4 is placed on the support 6 which is heated beforehand to be at a little higher temperature than a flow temperature, which is the heat-resistance temperature of the photoresist 4. Then, the chamber 7 should have been reduced to approximately $1 \times 10^{-1}$ torr. If necessary, the semiconductor wafer 5 is made to contact closely with the support 6 by a vacuum adhering system, not shown in said drawings. If the shutter 3 is opened in this state, the light emitted from the high pressure mercury vapor lamp 1 will be projected onto the photoresist 4. As the flow temperature of the photoresist 4 is raised by this exposure in such case, the power of the heater of the support 6 is controlled so that the temperature of the photoresist is a little higher than the flow temperature at the time the temperature of the photoresist is raised. When the treatment of the photoresist 4 is ended, heating is stopped, the shutter 3 is closed, and the exposure to the ultraviolet radiation is stopped. Then, cooling water is passed through the cooling conduit 11 to cool the semiconductor wafer 5 down to a prescribed temperature, and the vacuum adhering system is released so that the semiconductor wafer 5 can be removed from the support 6. After the treatment of the photoresist is completed, the pressure of gas in chamber 7 is returned to the normal atmospheric pressure and then a semiconductor wafer 5 is removed from said chamber. The above-described process may be repeated so as to treat the developed positive photoresist on a next wafer in sequence.

The following is a more concrete description of the method of treating the developed positive photoresist image or pattern or film.

The developed positive photoresist image was prepared on a semiconductor wafer by using nomolak type photoresist containing a dye, which is 2.0 $\mu$m of thickness. The initial flow temperature of this photoresist was apparently below about 125° C. because said image was distorted by heating at 125° C. for 30 minutes.

The semiconductor wafer having this photoresist image was set on a support heated at 125° C. and was exposed to ultraviolet radiation in a chamber filled with air of atmospheric pressure while the heating temperature of this photoresist was raised to 200° C. in 85 seconds. In this case, the final flow temperature was as high as 180° C. When the treating of ultraviolet irradiation and heating was stopped on the way to the proposed top temperature, that is, the photoresist on a wafer was kept at some temperature lower than the proposed top temperature, the developed positive photoresist image was distorted for 30 minutes at said temperature.

On the other hand, when the developed positive photoresist image prepared on a semiconductor wafer as set on a support heated to 125° C. in a chamber filled with gas of reduced pressure lower than $1 \times 10^{-3}$ torr and temperature was raised at a rate of 3° C./second while exposed to ultraviolet irradiation for 18 seconds, a heat-resistance temperature of this image reached 180° C. or more.

As described above, it takes 18 seconds to improve the heat-resistance temperature to 180° C. or more according to this invention. On the other hand, it takes 85 seconds to improve a heat-resistance temperature to 180° C. according to a prior-art. In other words, the productivity of treating the developed positive photoresist prepared on a semiconductor wafer by ultra-violet irradiation and heating was improved 4 times or more by employing this invention.

In the same way as in the foregoing embodiment, the change in the shape of a photoresist pattern was 1% or less in dimensions, and it was confirmed that practically no hindrance was caused thereby, although the heating temperature was kept a little higher than the flow temperature at the time the heating temperature was raised.

In addition to the above-described embodiments, exposure time for the ultraviolet radiation in gas of lower pressure is decreased by about 1/5 times that in gas of 1 atmospheric pressure. Consequently, arranging the developed positive photoresist image in gas of the reduced pressure has a remarkable effect for decreasing the time for treating the same.

What is claimed:

1. A method of treating a photoresist image developed on a semiconductor, comprising the steps of:
   placing the semiconductor with the developed photoresist image thereon under a reduced pressure atmosphere;
   exposing the photoresist image to ultraviolet radiation;
   increasing the temperature of the photoresist image in proportion to an increasing flow temperature of the photoresist image while continually exposing said photoresist image to said ultraviolet radiation; and
   controlling the increasing temperature of the photoresist image so that the photoresist image is maintained at a temperature greater than the increasing flow temperature of the photoresist image, during at least a portion of said continued exposure, and so as to prevent a substantial dimensional and shape change of the photoresist image.

2. A method according to claim 1, wherein the photoresist image is exposed initially to a temperature greater than an initial flow temperature of the photoresist image.

3. A method according to claim 1, wherein the semiconductor with the developed photoresist image thereon is placed under a reduced atmosphere of approximately $1 \times 10^{-1}$ torr.

4. A method according to claim 2, wherein the semiconductor with the developed photoresist image thereon is placed under a reduced atmosphere of approximately $1 \times 10^{-1}$ torr.

5. A method according to claim 1, including controlling the temperature of the photoresist image so that the dimensional change of the photoresist image is no greater than 1%.

6. A method according to claim 3, including controlling the temperature of the photoresist image so that the dimensional change of the photoresist image is no greater than 1%.

7. A method according to claim 1, wherein the temperature of the photoresist image is controlled so as to be higher than the flow temperature of the photoresist image during each step of the exposure.

8. A method according to claim 7, wherein the photoresist image is exposed initially to a temperature greater than an initial flow temperature of the photoresist image.

9. A method according to claim 7, wherein the semiconductor with the developed photoresist image thereon is placed under a reduce atmosphere of approximately $1 \times 10^{-1}$ torr.

10. A method according to claim 8, wherein the semiconductor with the developed photoresist image thereon is placed under a reduced atmosphere of approximately $1 \times 10^{-1}$ torr.

11. A method according to claim 9, including controlling the temperature of the photoresist image so that the dimensional change of the photoresist image is no greater than 1%.

12. A method according to claim 10, including controlling the temperature of the photoresist image so that the dimensional change of the photoresist image is no greater than 1%.

* * * * *